US009059208B2

United States Patent
Cheng et al.

(10) Patent No.: US 9,059,208 B2
(45) Date of Patent: Jun. 16, 2015

(54) REPLACEMENT GATE INTEGRATION SCHEME EMPLOYING MULTIPLE TYPES OF DISPOSABLE GATE STRUCTURES

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Mountain View, CA (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 13/859,802

(22) Filed: Apr. 10, 2013

(65) Prior Publication Data

US 2014/0308808 A1    Oct. 16, 2014

(51) Int. Cl.
  *H01L 29/66*  (2006.01)
  *H01L 21/8238*  (2006.01)
  *H01L 21/84*  (2006.01)

(52) U.S. Cl.
  CPC .. *H01L 29/66545* (2013.01); *H01L 21/823842* (2013.01); *H01L 21/823871* (2013.01); *H01L 21/84* (2013.01)

(58) Field of Classification Search
  CPC .................. H01L 21/823842; H01L 29/66545
  USPC ........................................................ 438/183
  See application file for complete search history.

(56) References Cited

U.S. PATENT DOCUMENTS

| 6,200,866 | B1  | 3/2001 | Ma et al. | |
|---|---|---|---|---|
| 6,251,729 | B1 * | 6/2001 | Montree et al. | 438/257 |
| 6,653,698 | B2  | 11/2003 | Lee et al. | |
| 6,709,912 | B1  | 3/2004 | Ang et al. | |
| 7,229,873 | B2  | 6/2007 | Colombo et al. | |
| 7,439,113 | B2  | 10/2008 | Doczy et al. | |
| 8,062,966 | B2 * | 11/2011 | Mehrad et al. | 438/592 |
| 2004/0053503 | A1 * | 3/2004 | Brask | 438/707 |
| 2004/0226918 | A1 * | 11/2004 | Lee et al. | 216/89 |
| 2005/0245036 | A1 * | 11/2005 | Datta et al. | 438/287 |
| 2005/0287748 | A1 * | 12/2005 | Kavalieros et al. | 438/299 |
| 2009/0087974 | A1 * | 4/2009 | Waite et al. | 438/592 |
| 2012/0068261 | A1  | 3/2012 | Kwon et al. | |
| 2012/0228680 | A1 * | 9/2012 | Matsuki | 257/288 |

* cited by examiner

*Primary Examiner* — Eduardo A Rodela
*Assistant Examiner* — John Bodnar
(74) *Attorney, Agent, or Firm* — Scully, Scott, Murphy & Presser, P.C.; H. Daniel Schnurmann

(57) ABSTRACT

A plurality of disposable gate materials is employed to form multiple types of disposable gate stack structures. Different types of disposable gate stack structures are sequentially removed and replaced with different types of replacement gate stack structures. Sequential removal of the different types of disposable gate stack structures can be effected by employing etch chemistries that remove one type of disposable gate material while not etching at least another type of disposable gate material. Different types of replacement gate stack structures can employ different work function materials. Lithographic patterning of workfunction materials is avoided, and each replacement gate stack structure can have a workfunction material portion having a uniform thickness.

18 Claims, 19 Drawing Sheets

REPLACEMENT GATE INTEGRATION SCHEME EMPLOYING MULTIPLE TYPES OF DISPOSABLE GATE STRUCTURES

BACKGROUND

The present disclosure generally relates to a method of forming a semiconductor structure, and particularly to a method of forming replacement gate structures employing multiple types of disposable gate structures.

Conventional methods for integrating more than one type of workfunction material in replacement gate structures employ some type of patterning of workfunction materials after deposition within gate cavities. Such methods result in non-uniformity in the workfunction material thickness in the replacement gate stack structures depending on the channel length and the pitch of short channel devices due to the non-uniformity of the etch process employed to pattern the workfunction materials. Thus, an integration scheme is desired that can provide replacement gate devices including a workfunction material layer having a geometry-independent uniform thickness.

SUMMARY

A plurality of disposable gate materials is employed to form multiple types of disposable gate stack structures. Different types of disposable gate stack structures are sequentially removed and replaced with different types of replacement gate stack structures. Sequential removal of the different types of disposable gate stack structures can be effected by employing etch chemistries that remove one type of disposable gate material while not etching at least another type of disposable gate material. Different types of replacement gate stack structures can employ different work function materials. Lithographic patterning of workfunction materials is avoided, and each replacement gate stack structure can have a workfunction material portion having a uniform thickness.

According to an aspect of the present disclosure, a method of forming a semiconductor structure is provided. A first disposable gate stack structure and a second disposable gate stack structure are formed in a first device region and in a second device region, respectively, on a semiconductor substrate. A planarization dielectric layer is deposited over the first and second disposable gate stack structures. Top surfaces of the first and second disposable gate stack structures are physically exposed by planarizing the planarization dielectric layer. The first disposable gate stack structure is replaced with a first replacement gate stack structure while at least a predominant portion of the second disposable gate stack structure remains within the planarization dielectric layer. The second disposable gate stack structure is replaced with a second replacement gate stack structure while the first replacement gate stack structure remains within the planarization dielectric layer.

DETAILED DESCRIPTION

Figure 1:
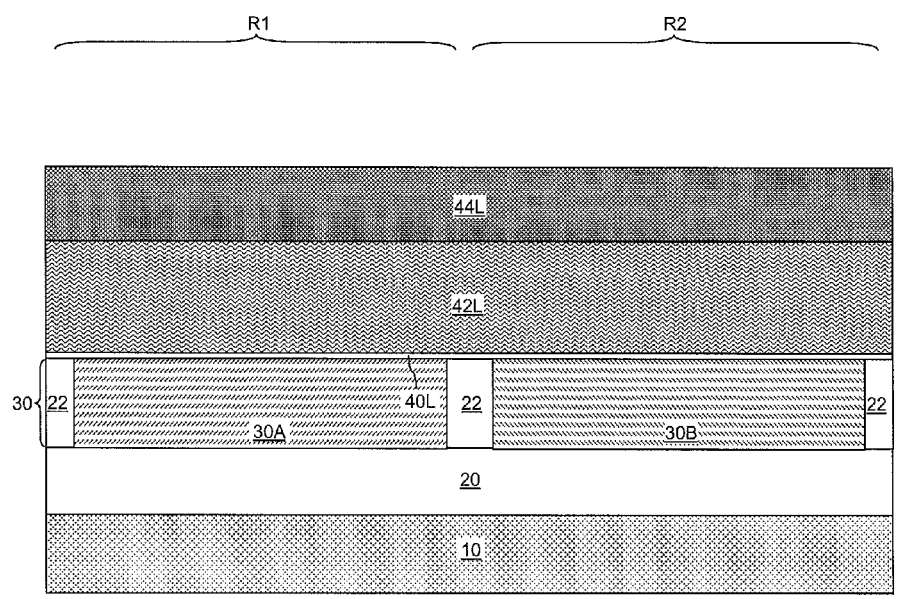
FIG. 1 is a vertical cross-sectional view of an exemplary semiconductor structure after formation of a disposable gate dielectric layer, a first disposable gate material layer, and a hard mask layer according to an embodiment of the present disclosure.

As stated above, the present disclosure relates to a method of forming a semiconductor structure, and particularly to a method of forming replacement gate structures employing multiple types of disposable gate structures. Aspects of the present disclosure are now described in detail with accompanying figures. Like and corresponding elements mentioned herein and illustrated in the drawings are referred to by like reference numerals. The drawings are not necessarily drawn to scale. As used herein, ordinals are employed merely to distinguish similar elements, and different ordinals may be employed to designate a same element in the specification and/or claims.

Referring to FIG. 1, an exemplary semiconductor structure according to an embodiment of the present disclosure includes a semiconductor substrate, which can be a semiconductor-on-insulator (SOI) substrate, a bulk substrate, or a hybrid substrate including a bulk portion and an SOI portion. In one embodiment, the substrate can be an SOI substrate including a stack, from bottom to top, of a handle substrate 10, a buried insulator layer 20, and a top semiconductor layer 30. The handle substrate 10 can include a semiconductor material, a conductive material, or a dielectric material, and provides mechanical support to the buried insulator layer 20 and the top semiconductor layer 30. The thickness of the handle substrate 10 can be from 50 microns to 2 mm, although lesser and greater thicknesses can also be employed. The buried insulator layer 20 includes a dielectric material such as silicon oxide, silicon nitride, silicon oxynitride or a combination thereof. The thickness of the buried insulator layer 20 can be from 10 nm to 1,000 nm, although lesser and greater thicknesses can also be employed.

The top semiconductor layer 30 includes a semiconductor material, which can be an elemental semiconductor material such as silicon or germanium, an alloy of at least two elemental semiconductor materials such as a silicon-germanium alloy, a compound semiconductor material, or any other semiconductor material known in the art. The thickness of the top semiconductor layer 30 can be from 30 nm to 600 nm, although lesser and greater thicknesses can also be employed. The top semiconductor layer 30 can include a single crystalline semiconductor material, a polycrystalline semiconductor material, or an amorphous semiconductor material. Various portions of the top semiconductor layer 30 may be doped with electrical dopants. An "electrical dopant" refers to a dopant that introduces free electrical charges in a semiconductor material, and can be a p-type dopant or an n-type dopant. Exemplary p-type dopants include B, Ga, and In, and exemplary n-type dopants include P, As, and Sb. Different portions of the top semiconductor layer 30 may include different semiconductor materials. In one embodiment, the top semiconductor layer 30 includes a single crystalline semiconductor material such as single crystalline silicon and/or a single crystalline silicon-germanium alloy.

The top semiconductor layer 30 is patterned to form a plurality of semiconductor material portions. The plurality of semiconductor material portions can include, for example, a first semiconductor material portion 30A formed in a first device region R1 and a second semiconductor material portion 30B formed in a second device region R2.

The formation of the semiconductor material portions (30A, 30B) by patterning of a semiconductor material layer can be performed, for example, by a combination of a lithographic method and an anisotropic etch. The buried insulator layer 20 can be employed as a stopping layer for the anisotropic etch. The plurality of semiconductor material portions (30A, 30B) can be formed directly on the top surface of the buried insulator layer 20.

In one embodiment, the semiconductor material portions (30A, 30B) can be patterned as planar active semiconductor regions for forming planar field effect transistors. As used herein, a "planar field effect transistor" refers to a field effect transistor in which a predominant portion of the interface between the channel region and the gate dielectric is at least one horizontal surface. In this case, shallow trench isolation structures 22 including a dielectric material can be formed within the top semiconductor layer 20, for example, by filling shallow trenches that separate each semiconductor material portion (30A, 30B) with a dielectric material, and by removing excess portions of the dielectric material from above the top surfaces of the semiconductor material portions (30A, 30B).

In another embodiment, the semiconductor material portions (30A, 30B) can be semiconductor fins that can be employed to form fin field effect transistors. As used herein, a "fin field effect transistor" refers to a field effect transistor in which a predominant portion of the interface between the channel region and the gate dielectric is at least one vertical surface. In this case, the semiconductor fins can be located on the top surface of the buried insulator layer 20, and the semiconductor fins can be laterally spaced from one another by gaps. Each semiconductor fin includes a parallel pair of substantially vertical sidewalls that extend along a lengthwise direction of the semiconductor fin. As used herein, a "lengthwise direction" of an object refers to a direction about which the moment of inertia of the object becomes the minimum. Each semiconductor fin laterally extends along a fin direction, which is the lengthwise direction of the semiconductor fin. Shallow trench isolation structures may not be present in this case, or top surfaces of shallow trench isolation structures 22 may be recessed below the topmost surfaces of the semiconductor fins so that sidewalls of the semiconductor fins are physically exposed.

If the substrate 8 is a bulk substrate, the semiconductor material portions (30A, 30B) formed by an anisotropic etch can be electrically isolated by forming shallow trench isolation structures 22 including a dielectric material and/or by forming doped wells that can be employed to form reverse biased p-n junctions. If the semiconductor material portions (30A, 30B) on a bulk substrate are to be employed as semiconductor fins, top surfaces of the shallow trench isolation structures 22 can be recessed relative to the top surfaces of the semiconductor fins, i.e., the top surfaces of the semiconductor material portions (30A, 30B).

A disposable gate dielectric layer 40L can be formed on the top surface of the semiconductor substrate, i.e., on the surfaces of the semiconductor material portions (30A, 30B). The disposable gate dielectric layer 40L includes a dielectric material such as silicon oxide, silicon nitride, silicon oxynitride, a dielectric metal oxide having a dielectric constant greater than 8.0, an organosilicate glass (OSG), or any other dielectric material that can function as a stopping layer during removal of disposable gate materials to be deposited on the disposable gate dielectric layer 40L. The disposable gate dielectric layer 40L can be formed, for example, by chemical vapor deposition (CVD), atomic layer deposition (ALD), conversion of surface portions of the semiconductor material portions (30A, 30B) into a dielectric material, or a combination thereof. The thickness of the disposable gate dielectric layer 40L can be, for example, from 1 nm to 30 nm, although lesser and greater thicknesses can also be employed. The disposable gate dielectric layer 40L is optional, i.e., may, or may not, be present as long as etch chemistries for removing disposable gate materials selective to the semiconductor materials of the semiconductor material portions (30A, 30B) exists.

A first disposable gate material layer 42L is deposited over the disposable gate dielectric layer. The first disposable gate material layer 42L includes a first disposable gate material, which can be a semiconductor material or a metallic material. The first disposable gate material layer 42L can be deposited, for example, by chemical vapor deposition (CVD), physical vapor deposition (PVD), vacuum evaporation, or any other deposition method for deposition a semiconductor material or a metallic material. The first disposable gate material layer 42L can be deposited in the first and second device regions (R1, R2) simultaneously. The thickness of the first disposable gate material layer 42L can be about, or greater than, the height of replacement gate stack structures to be subsequently formed. In one embodiment, the thickness of the first disposable gate material layer 42L can be from 30 nm to 600 nm, although lesser and greater thicknesses can also be employed. The first disposable gate material layer 42L may be polycrystalline or amorphous.

In one embodiment, the first disposable gate material layer 42L can include a semiconductor material, which can be a doped or undoped elemental semiconductor material, a doped or undoped alloy of at least two elemental semiconductor materials, or a doped or undoped compound semiconductor material. If the first disposable gate material layer 42L includes a doped semiconductor material, the dopant atoms present within the doped semiconductor material may be p-type dopants or n-type dopants.

In another embodiment, the first disposable gate material layer 42L can include a metallic material, which can be an elemental metal, an intermetallic alloy, a conductive metallic compound, or combinations of thereof. For example, the first disposable gate material layer 42L can include one or more of Cu, Al, W, Ti, Ta, Ni, Co, TiN, TaN, WN, TiC, TaC, WC, and other conductive metallic materials.

A hard mask layer 44L can be subsequently deposited over the first disposable gate material layer 42L. The hard mask layer 44L can include a dielectric material such as silicon oxide, silicon nitride, silicon oxynitride, a dielectric metal oxide, or a combination thereof. The hard mask layer 44L can be formed, for example, by chemical vapor deposition (CVD). The thickness of the hard mask layer 44L can be from 30 nm to 300 nm, although lesser and greater thicknesses can also be employed.

Figure 2:
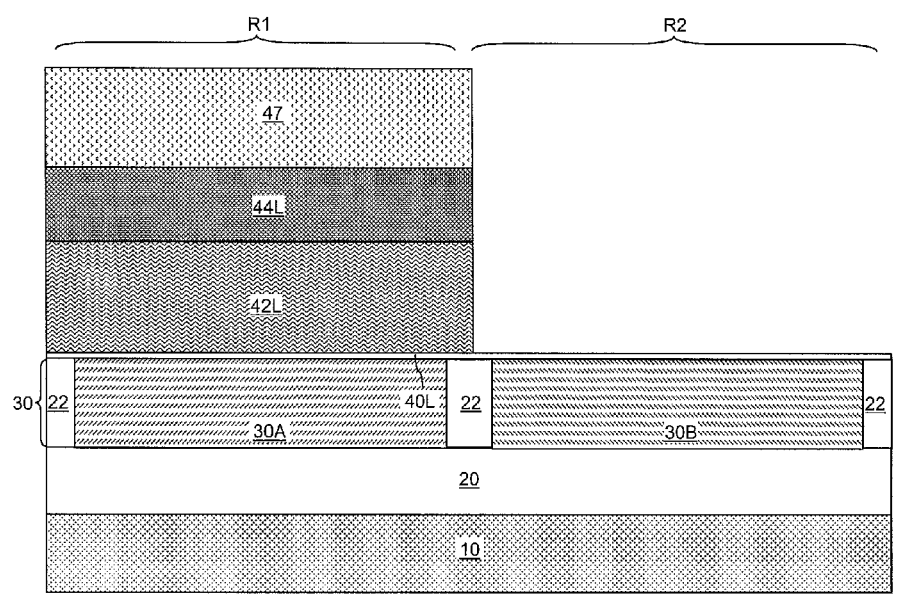
FIG. 2 is a vertical cross-sectional view of the exemplary semiconductor structure after patterning the hard mask layer and the first disposable gate material layer according to an embodiment of the present disclosure.

Referring to FIG. 2, a photoresist layer 47 is applied over the hard mask layer 44L, and is lithographically patterned to cover a device region. The covered device region can be, for example, the first device region R1 or the second device region R2. In one embodiment, one of the first device region R1 and the second device region R2 can be covered with a patterned portion of the photoresist layer 47, and the photoresist layer 47 can be removed from the other of the first device region R1 and the second device region R2.

The pattern in the photoresist layer 47 is transferred through the hard mask layer 44L and the first disposable gate material layer 42L by an etch process that employs the photoresist layer 47 as an etch mask. In one embodiment, the hard mask layer 42L is patterned such that a portion of the hard mask layer 42L is removed from one of the first and second device regions (R1, R2). The etch process can be an anisotropic etch process such as a reactive ion etch (RIE) process, or can be an isotropic etch process such as a wet etch process. The portions of the hard mask layer 44L and the first disposable gate material layer 42L that are not covered by the photoresist layer 47 are removed by the etch process. In one embodiment, if the disposable gate dielectric layer 40L is present, the disposable gate dielectric layer 40L can be employed as an etch stop layer during removal of the physically exposed portions of the first disposable gate material layer 42L. The photoresist layer 47 can be subsequently removed, for example, by ashing.

Figure 3:
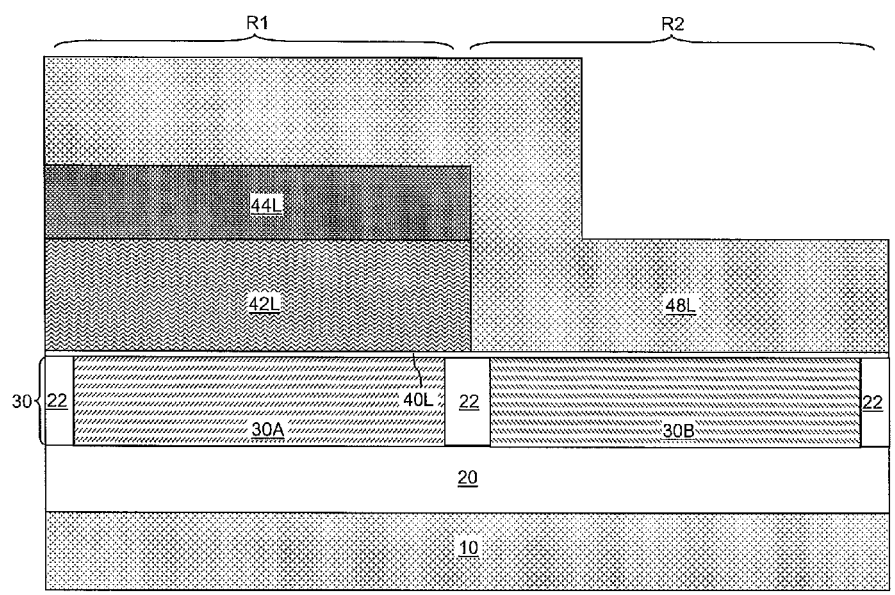
FIG. 3 is a vertical cross-sectional view of the exemplary semiconductor structure after deposition of a second disposable gate material layer according to an embodiment of the present disclosure.

Referring to FIG. 3, a second disposable gate material layer 48L is formed at least in the second device region R2 over the semiconductor substrate (10, 20, 30). In one embodiment, the second disposable gate material layer 48L can be deposited over the entirety of the semiconductor substrate (10, 20, 30). The second disposable gate material layer 48L is deposited in the first and second device regions (R1, R2) simultaneously. In one embodiment, the second disposable gate material layer 48L can be deposited conformally.

The second disposable gate material layer 48L includes a second disposable gate material, which can be a semiconductor material or a metallic material. The second disposable gate material is different from the first disposable gate material in composition. The pair of the first disposable gate material and the second disposable gate material are formed such that an etch chemistry exists that can remove one of the first and second disposable gate materials selective to the other of the first and second disposable gate materials.

The second disposable gate material layer 48L can be deposited, for example, by chemical vapor deposition (CVD), physical vapor deposition (PVD), vacuum evaporation, or any other deposition method for deposition a semiconductor material or a metallic material. The second disposable gate material layer 48L can be deposited in the first and second device regions (R1, R2) simultaneously. The thickness of the second disposable gate material layer 48L, as measured over a planar surface, can be about, or greater than, the height of replacement gate stack structures to be subsequently formed. In one embodiment, the thickness of the second disposable gate material layer 48L can be from 30 nm to 600 nm, although lesser and greater thicknesses can also be employed. The second disposable gate material layer 48L may be polycrystalline or amorphous.

In one embodiment, the second disposable gate material layer 48L can include a semiconductor material, which can be a doped or undoped elemental semiconductor material, a doped or undoped alloy of at least two elemental semiconductor materials, or a doped or undoped compound semiconductor material. If the second disposable gate material layer 48L includes a doped semiconductor material, the dopant atoms present within the doped semiconductor material may be p-type dopants or n-type dopants.

In another embodiment, the second disposable gate material layer 48L can include a metallic material, which can be an elemental metal, an intermetallic alloy, a conductive metallic compound, or combinations of thereof. For example, the second disposable gate material layer 48L can include one or more of Cu, Al, W, Ti, Ta, Ni, Co, TiN, TaN, WN, TiC, TaC, WC, and other conductive metallic materials.

In one embodiment, the first disposable gate material can include a first semiconductor material, and the second disposable gate material can include a second semiconductor material. In a further embodiment, the first semiconductor material can be a doped or undoped silicon-germanium alloy, and the second semiconductor material can be doped or undoped silicon. In further another embodiment, the first semiconductor material can be doped or undoped silicon, and the second semiconductor material is a doped or undoped silicon-germanium alloy. The dopants in the first semiconductor material and/or the second semiconductor material can be independently selected among p-type dopants or n-type dopants.

In another embodiment, one of the first semiconductor material and the second semiconductor material can include an elemental semiconductor material, and the other of the first semiconductor material and the second semiconductor material include a compound semiconductor material.

In yet another embodiment, one of the first semiconductor material and the second semiconductor material comprises a semiconductor material, and another of the first semiconductor material and the second semiconductor material comprises a metallic material.

Figure 4:
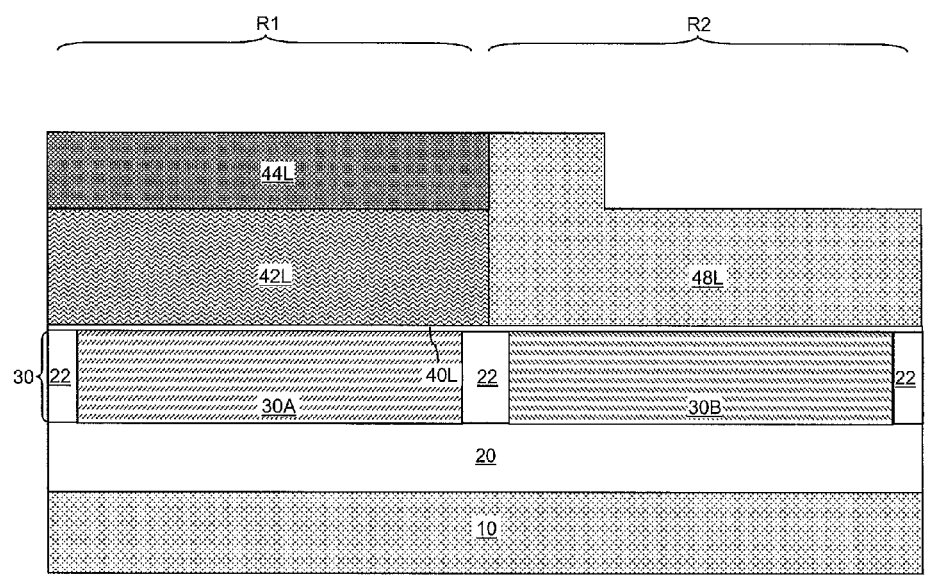
FIG. 4 is a vertical cross-sectional view of the exemplary semiconductor structure removal of a portion of the second disposable gate material layer above the top surface of the hard mask layer by planarization according to an embodiment of the present disclosure.

Referring to FIG. 4, a portion of the second disposable gate material layer 48L in the first device region R1 can be removed from above the top surface of the hard mask layer 44L by planarization. The planarization can be performed, for example, by a chemical mechanical planarization (CMP) process that employs the hard mask layer 44L as a stopping layer.

While the present disclosure is described employing an embodiment in which the first disposable gate material layer 42L is formed prior to formation of the second disposable gate material layer 48L, embodiment in which the order of formation of the two disposable gate material layers (42L, 48L) is reversed are expressly contemplated herein. In general, if one of first and second disposable gate material layers is formed first, follower by formation of a hard mask layer, patterning of the hard mask layer and the underlying disposable gate material layer, and formation of another of the first and second disposable gate material layers, a portion of the other of the first and second disposable gate material layers can be removed from above the patterned portion of the hard mask layer by planarization employing the patterned portion of the hard mask layer as a stopping layer.

Figure 5:
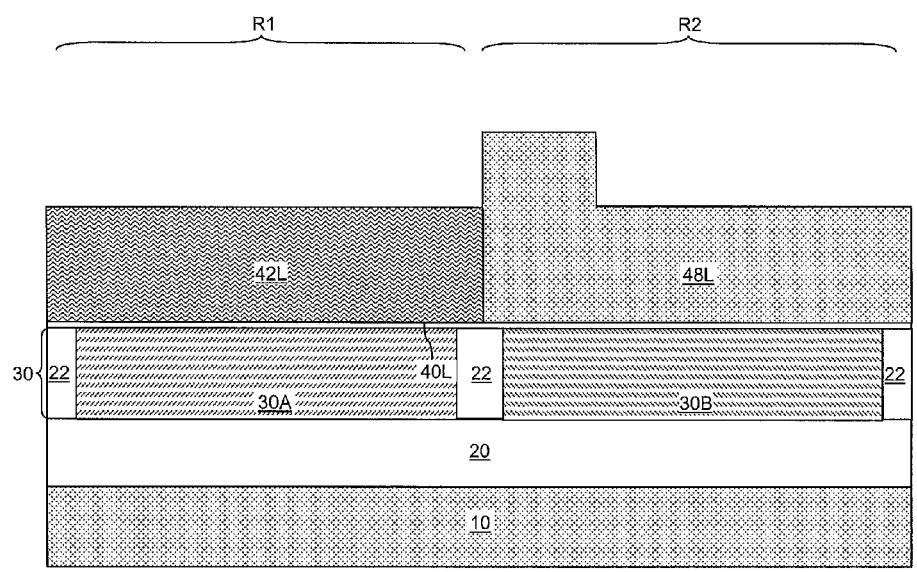
FIG. 5 is a vertical cross-sectional view of the exemplary semiconductor structure after removal of the hard mask layer according to an embodiment of the present disclosure.

Referring to FIG. 5, the hard mask layer 44L can be removed selective to the first and second disposable gate material layers 42L. For example, if the hard mask layer 44L includes silicon nitride, the hard mask layer 44L can be removed by a wet etch employing hot phosphoric acid. If the hard mask layer 44L includes silicon oxide, the hard mask layer 44L can be removed by a wet etch employing hydrofluoric acid.

Figure 6:
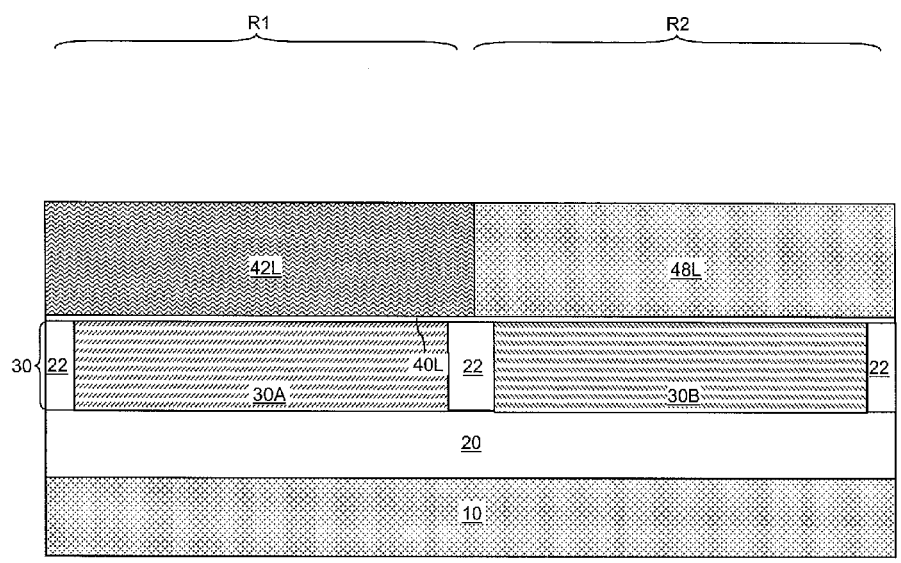
FIG. 6 is a vertical cross-sectional view of the exemplary semiconductor structure after removal of a protruding portion of the second disposable gate material layer according to an embodiment of the present disclosure.

Referring to FIG. 6, any protruding portions of the second disposable gate material layer 48L can be removed, for example, by a touch-up planarization process, i.e., a planarization process designed to remove only protruding portions while minimizing removal of bulk portions of the first and second disposable gate material layers (42L, 48L). In general, remaining portions of the first and second disposable gate material layers can be planarized and protruding portions may be removed by a planarization process, which is herein referred to as a second planarization.

While an embodiment in which the first disposable gate material layer is deposited prior to deposition of the second disposable gate material layer, embodiments are herein expressly contemplated in which the second disposable gate material layer is deposited and patterned such that a remaining portion of the second disposable gate material layer is provided in the second device region R2 prior to deposition of the first disposable gate material layer over the entirety of the semiconductor substrate (10, 20, 30) and the remaining portion of the second disposable gate material layer. A hard mask layer may be present over the remaining portion of the second disposable gate material layer and under the first disposable gate material layer in the second device region R2. In one embodiment, the hard mask layer may be deposited as a blanket layer, and can be patterned such that a portion of the hard mask layer 42L is removed from one of the first and second device regions (R1, R2), wherein another of the first and second disposable gate material layers is formed over a patterned portion of the hard mask layer. The portion of the first disposable gate material layer in the second device region R2 and the hard mask layer may be removed employing the processing steps illustrated in FIGS. 4-6 to provide the same structure as the exemplary structure illustrated in FIG. 6.

Figure 7:
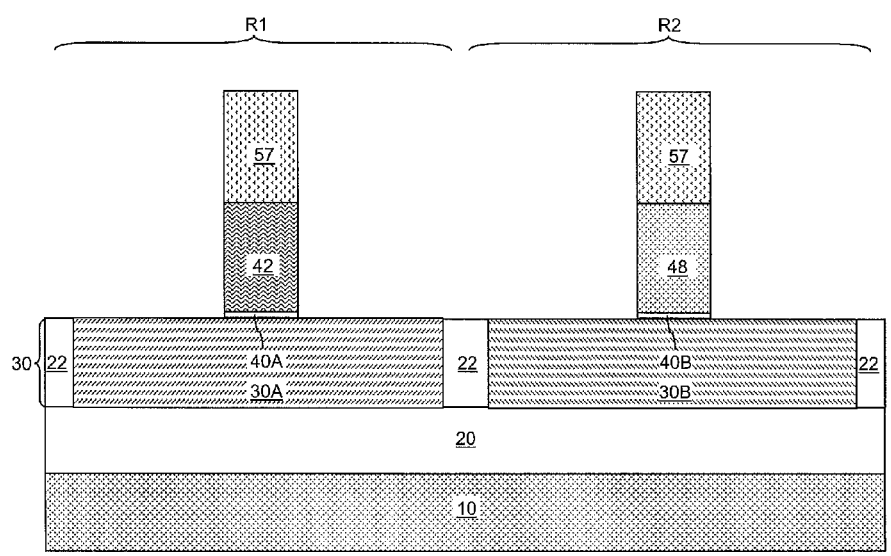
FIG. 7 is a vertical cross-sectional view of the exemplary semiconductor structure after patterning of the first and second disposable gate material layers to form a first and second disposable gate stack structures, respectively, according to an embodiment of the present disclosure.

Referring to FIG. 7, the first and second disposable gate material layers (42L, 48L) and the disposable gate dielectric layer 40L can be patterned to form a first disposable gate stack structure (40A, 42) and a second disposable gate stack structure (40B, 48). The first disposable gate stack structure (40A, 42) includes a portion of the first disposable gate material layer 42L (which is herein referred to as a first disposable gate material portion 42) and a first portion of the disposable gate dielectric layer 40L (which is herein referred to as a first disposable gate dielectric portion 40A). The second disposable gate stack structure (40B, 48) includes a portion of the second disposable gate material layer 48L (which is herein referred to as a second disposable gate material portion 48) and a second portion of the disposable gate dielectric layer 40L (which is herein referred to as a second disposable gate dielectric portion 40B). The first disposable gate stack structure (40A, 42) and the second disposable gate stack structure (40B, 48) are formed in the first device region R1 and in the second device region R2, respectively, on the semiconductor substrate (10, 20, 30).

The patterning of the first and second disposable gate material layers (42L, 48L) and the disposable gate dielectric layer 40L can be performed, for example, by applying a photoresist layer 57 over the first and second disposable gate material layers (42L, 48L), lithographically patterning the photoresist layer 57, and transferring the pattern in the photoresist layer 57 through the first and second disposable gate material layers (42L, 48L) and the disposable gate dielectric layer 40L by an anisotropic etch that employs remaining portions of the photoresist layer 57 as an etch mask. The remaining portions of the photoresist layer 57 can be removed, for example, by ashing.

Figure 8:
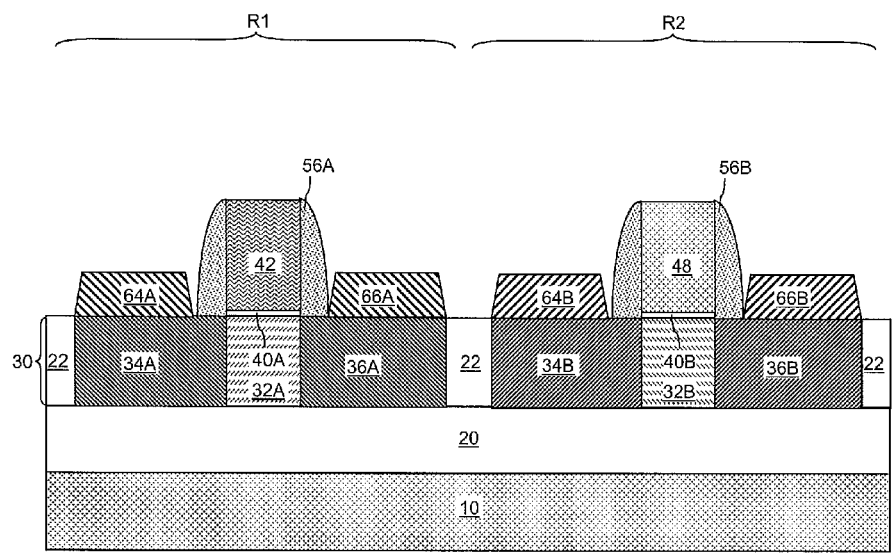
FIG. 8 is a vertical cross-sectional view of the exemplary semiconductor structure after formation of raised source regions and raised drain regions according to an embodiment of the present disclosure.

Referring to FIG. 8, source regions (34A, 34B) and drain regions (36A, 36B) can be formed in the first semiconductor material portion 30A and the second semiconductor material portion 30B, respectively, by at least one ion implantation process. Implantation masks may be optionally employed to confine regions in which dopant ions (which can be p-type dopants or n-type dopants) are implanted into the top semiconductor layer 30. Unimplanted portions of the first and second semiconductor material portions (30A, 30B) are herein referred to as a first body region 32A and a second body region 32B, respectively.

Optionally, gate spacers (56A, 56B) including a dielectric material can be simultaneously formed around each of the first and second disposable gate stack structures (40A, 42; 40B, 48) by deposition of a conformal dielectric material layer and an anisotropic etch. A p-n junction, a p-i junction (a junction between a p-doped semiconductor material and an intrinsic semiconductor material), or an n-i junction (a junction between an n-doped semiconductor material and an intrinsic semiconductor material) can be formed at an interface between each body region (32A, 32B) and a neighboring source region (34A, 34B) or a neighboring drain region (36A, 36B). The gate spacers (56A, 56B) can be employed to adjust the location of the p-n junctions, the p-i junctions, and/or the n-i junctions. In one embodiment, the first gate spacer 56A can be formed around the first disposable gate stack structure (40A, 42) and the second gate spacer 56B can be formed around the second disposable gate stack structure (40B, 48). The first and second gate spacers (56A, 56B) can be formed simultaneously.

Optionally, raised source regions (64A, 64B) and raised drain regions (66A, 66B) can be formed on the source regions (34A, 34B) and the drain regions (36A, 36B), respectively. The raised source regions (64A, 64B) and the raised drain regions (66A, 66B) can be formed, for example, by selective epitaxy of at least one semiconductor material, which can be the same as, or can be different from, any of the semiconductor material(s) in the source regions (34A, 34B) and/or the drain regions (36A, 36B). The raised source regions (64A, 64B) and the raised drain regions (66A, 66B) can be formed with in-situ doping, or may be doped after selective epitaxy by ion implantation of plasma doping.

Figure 9:
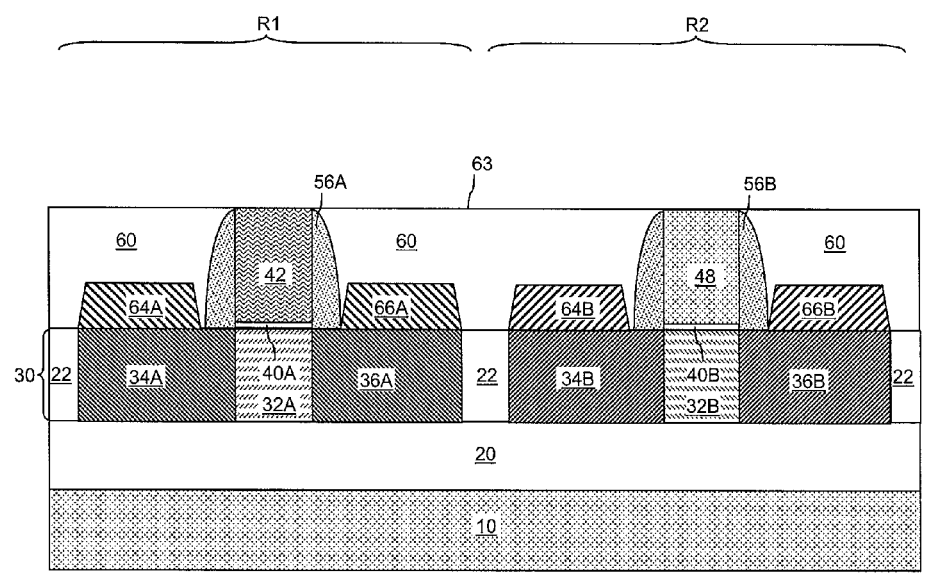
FIG. 9 is a vertical cross-sectional view of the exemplary semiconductor structure after deposition and planarization of a planarization dielectric layer according to an embodiment of the present disclosure.

Referring to FIG. 9, a dielectric material layer is deposited over the first and second disposable gate stack structure (40A, 42; 40B, 48). The deposited dielectric material layer is herein referred to as a planarization dielectric layer 60. The planarization dielectric layer 60 includes a dielectric material, which can be, for example, doped or undoped silicon oxide, silicon nitride, silicon oxynitride, or a combination thereof. In one embodiment, the planarization dielectric layer 60 includes silicon oxide. The planarization dielectric layer 60 can be deposited, for example, by chemical vapor deposition (CVD). The thickness of the planarization dielectric layer 60 as deposited can be controlled such that all portions of the top surface of the planarization dielectric layer 60 are located at, or above, top surfaces of the first and second disposable gate stack structures (40A, 42; 40B, 48).

The planarization dielectric layer 60 is subsequently planarized. Top surfaces of the first and second disposable gate stack structures (40A, 42; 40B, 48) are physically exposed by the planarization of the planarization dielectric layer 60. In one embodiment, the disposable gate material portions (42, 48) can be employed as an endpoint layer during the planarization. After the planarization of the planarization dielectric layer 60, a planar dielectric surface 63 of the planarization dielectric layer 60 can be coplanar with each top surface of the first and second disposable gate stack structures (40A, 42; 40B, 48).

Figure 10:
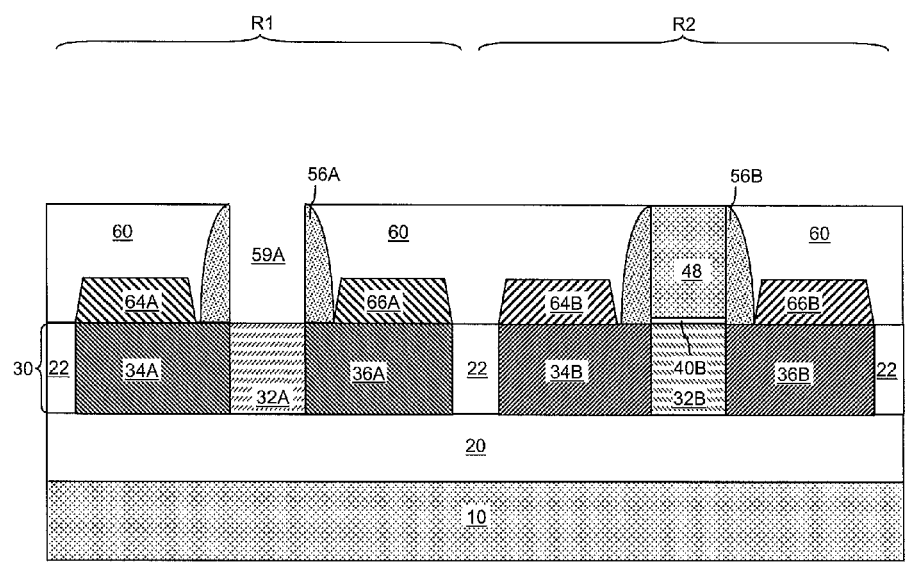
FIG. 10 is a vertical cross-sectional view of the exemplary semiconductor structure after removal of the first disposable gate stack structure according to an embodiment of the present disclosure.

Referring to FIG. 10, one of the first disposable gate stack structure (40A, 42) and the second disposable gate stack structure (40B, 48) is removed selective to the dielectric material of the planarization dielectric layer 60 and selective to the other of first disposable gate stack structure (40A, 42) and the second disposable gate stack structure (40B, 48). For example, the first disposable gate material portion 42 can be removed selective to the second disposable gate material portion 48, or vice versa.

No photoresist layer is needed at this step. Thus, no photoresist material is present on the top surfaces of the planarization dielectric layer 60. An etch chemistry that removes one of the first and second disposable gate materials selective to the other of the first and second disposable gate materials and selective to the dielectric material of the planarization dielectric material layer 60 is employed. A first gate cavity 59A is formed in a volume from which one of the first and second disposable gate material portions (42, 48) is removed. An underlying disposable gate dielectric portion (40A or 40B) can be removed by another etch from underneath the first gate cavity 59A. This etch can be an anisotropic etch or an isotropic etch. While the present disclosure is illustrated employing an embodiment in which the first disposable gate material portion 42 is removed selective to the second disposable gate material portion 48 and the first gate cavity 59A is formed in a space from which the first disposable gate stack structure (40A, 42) is removed, embodiments are expressly contemplated herein in which the second disposable gate material portion 48 is removed selective to the first disposable gate material portion 42 and the first gate cavity is formed in a space from which the second disposable gate stack structure (40B, 48) is removed.

In one embodiment, the first disposable gate material portion can be removed at an etch rate that is at least 3 times greater than an etch rate of the second disposable gate material portion. In another embodiment, the first disposable gate material portion is removed at an etch rate that is at least 10 times greater than an etch rate of the second disposable gate material portion.

In an illustrative example, the first disposable gate material can include a silicon-germanium alloy and the second disposable gate material can include silicon. In this case, the etch chemistry that removes the first disposable gate material selective to the second disposable gate material can employ a mixture of hydrofluoric acid and hydrogen peroxide. Alternate etch chemistries for selectively etching a silicon-germanium alloy selective to a germanium-free silicon material as known in the art can also be employed.

In another illustrative example, the first disposable gate material can be silicon that is free of germanium (i.e., undoped silicon, p-doped silicon, or n-doped silicon) and the second disposable gate material can include a silicon-germanium alloy. Removal of the germanium-free silicon material, i.e., a semiconductor material consisting essentially of silicon and optional electrical dopants (p-type dopants or n-type dopants) can be performed by an isotropic dry etch employing a mixture of $CF_4$, $N_2$, $O_2$, and $CH_2F_2$. The dry etch chemistry can be implemented as a plasma etch, for example, at a pressure in a range from 300 mT to 1,500 mT. The ratio of flow rates among $CF_4$, $N_2$, $O_2$, and $CH_2F_2$ can be, for example, 3:2:5:1, although variations of the ratio can be employed provided that selectivity is present between removal of the germanium-free silicon material and removal of the silicon-germanium alloy.

Figure 11:
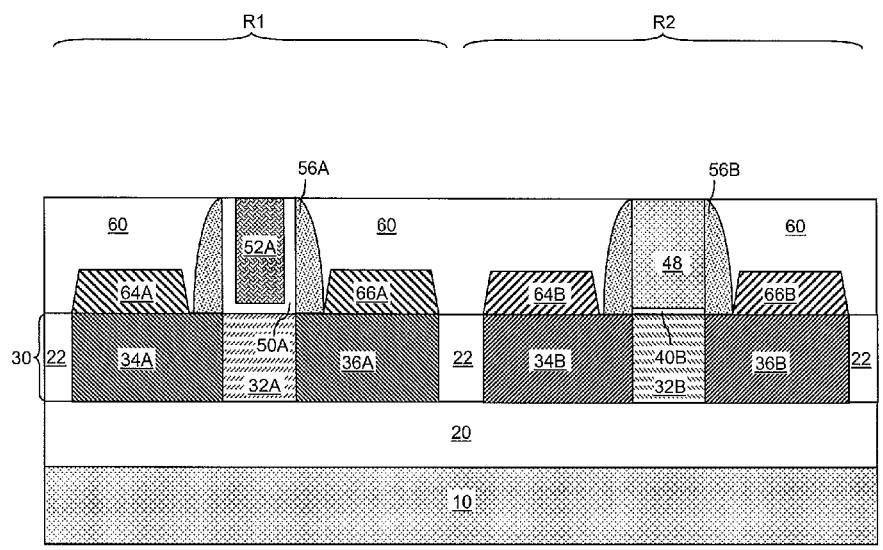
FIG. 11 is a vertical cross-sectional view of the exemplary semiconductor structure after formation of a first replacement gate stack structure according to an embodiment of the present disclosure.

Referring to FIG. 11, the first gate cavity 59A is filled with replacement gate material layers. The replacement gate material layers can include, for example, a first gate dielectric material layer and at least one first gate electrode material layer.

In one embodiment, the first gate dielectric material layer can include a dielectric metal oxide having a dielectric constant greater than 8.0 and/or a dielectric material including a semiconductor atom such as silicon oxide, silicon nitride, and silicon oxynitride. The first gate dielectric material layer can be formed, for example, by atomic layer deposition (ALD), chemical vapor deposition (CVD), and/or conversion of surface portions of a semiconductor material underlying the first gate cavity 59A by oxidation, nitridation, or combinations thereof.

In one embodiment, the at least one first gate electrode material layer can include any workfunction material as known in the art. Exemplary workfunction materials include, but are not limited to, TiN, TaN, WN, Ti, Ta, and W. Alternatively or additionally, the at least one first gate electrode material can include a doped semiconductor material such as doped polysilicon or a doped silicon-germanium alloy. The at least one first gate electrode material layer can be deposited, for example, by chemical vapor deposition (CVD), physical vapor deposition (PVD), atomic layer deposition (ALD), or a combination thereof.

Excess portions of the first gate dielectric material layer and the at least one first gate electrode material layer can be removed from above the top surface of the planarization dielectric layer 60 by a planarization process, which can employ, for example, chemical mechanical planarization (CMP). A remaining portion of the first gate dielectric material layer within the first gate cavity 59A constitutes a first gate dielectric 50A, and a remaining portion of the at least one first gate electrode material layer within the first gate cavity 59A constitutes a first gate electrode 52A. The first gate dielectric 50A and the first gate electrode 52A collectively fill the first gate cavity 59A and constitute a gate stack structure, which is herein referred to as a first replacement gate stack structure (50A, 52A).

Thus, the first disposable gate stack structure (40A, 42) is replaced with a first replacement gate stack structure (50A, 52A) while at least a predominant portion of the second disposable gate stack structure (40B, 48) remains within the planarization dielectric layer 60. As used herein, a predominant portion of an element refers to any portion of the element that occupies more than 50% of the entire volume of the element. In one embodiment, the first disposable gate stack structure (40A, 42) can be replaced with a first replacement gate stack structure (50A, 52A) while the entirety of the second disposable gate stack structure (40B, 48) remains within the planarization dielectric layer 60. In one embodiment, the top surface of the second disposable gate stack structure (40B, 48) can be substantially coplanar with the top surface of the planarization dielectric layer 60 after formation of the first replacement gate stack structure (50A, 52A).

The selection of the material(s) of the at least one first gate electrode material layer can be performed so that performance may be optimized, or maximized, for a field effect transistor including the first source region 34A, the first drain region 36A, the first body region 32A, and the first replacement gate stack structure (50A, 52A).

Figure 12:
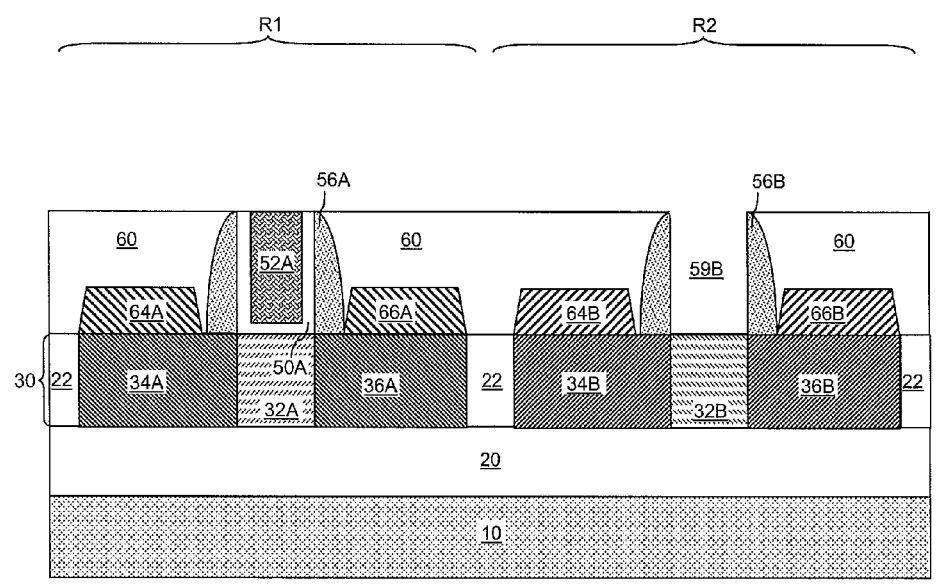
FIG. 12 is a vertical cross-sectional view of the exemplary semiconductor structure after removal of the second disposable gate stack structure according to an embodiment of the present disclosure.

Referring to FIG. 12, the other of the first disposable gate stack structure (40A, 42) and the second disposable gate stack structure (40B, 48), i.e., the disposable gate stack structure that is not removed at the processing step of FIG. 10, is removed selective to the dielectric material of the planarization dielectric layer 60 and selective to the materials of the first replacement gate stack structure (50A, 52A). For example, the second disposable gate material portion 48 can be removed selective to the first replacement gate stack structure (50A, 52A).

No photoresist layer is needed at this step. Thus, no photoresist material is present on the top surfaces of the planarization dielectric layer 60. An etch chemistry that removes on the other of the first and second disposable gate materials selective to the first replacement gate stack structure (50A, 52A) and selective to the dielectric material of the planarization dielectric material layer 60 is employed. A second gate cavity 59B is formed in a volume from which the other of the first and second disposable gate material portions (42, 48) is removed. An underlying disposable gate dielectric portion (e.g., 40B) can be removed by another etch from underneath the second gate cavity 59B. This etch can be an anisotropic etch or an isotropic etch.

In one embodiment, the second disposable gate material portion can be removed at an etch rate that is at least 3 times greater than an etch rate of the materials of the first replacement gate stack structure (50A, 52A). In another embodiment, the first disposable gate material portion is removed at an etch rate that is at least 10 times greater than an etch rate of the materials of the first replacement gate stack structure (50A, 52A).

Figure 13:
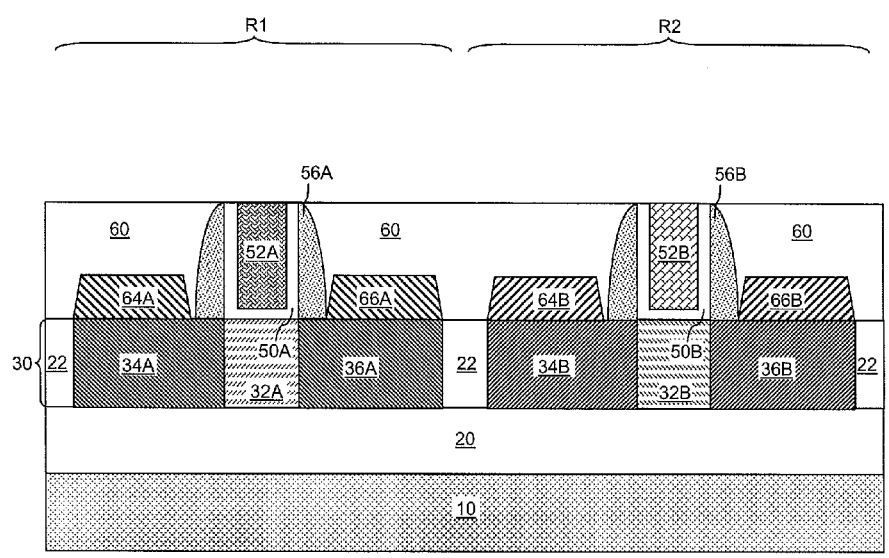
FIG. 13 is a vertical cross-sectional view of the exemplary semiconductor structure after formation of a second replacement gate stack structure according to an embodiment of the present disclosure.

Referring to FIG. 13, the second gate cavity 59B is filled with replacement gate material layers. The replacement gate material layers can include, for example, a second gate dielectric material layer and at least one second gate electrode material layer.

In one embodiment, the second gate dielectric material layer can include a dielectric metal oxide having a dielectric constant greater than 8.0 and/or a dielectric material including a semiconductor atom such as silicon oxide, silicon nitride, and silicon oxynitride. The second gate dielectric material layer can be formed, for example, by atomic layer deposition (ALD), chemical vapor deposition (CVD), and/or conversion of surface portions of a semiconductor material underlying the second gate cavity 59A by oxidation, nitridation, or combinations thereof. The thickness of the second gate dielectric material layer can be the same as, or can be different from, the thickness of the first gate dielectric material layer. Further, the composition of the second gate dielectric material layer can be the same as, or can be different from, the thickness of the first gate dielectric material layer.

In one embodiment, the at least one second gate electrode material layer can include any workfunction material as known in the art. Exemplary workfunction materials include, but are not limited to, TiN, TaN, WN, Ti, Ta, and W. Alternatively or additionally, the at least one second gate electrode material can include a doped semiconductor material such as doped polysilicon or a doped silicon-germanium alloy. The at least one second gate electrode material layer can be deposited, for example, by chemical vapor deposition (CVD), physical vapor deposition (PVD), atomic layer deposition (ALD), or a combination thereof. The thickness of the at least one second gate electrode material layer can be the same as, or can be different from, the thickness of the at least one first gate electrode material layer. Further, the composition of the at least one second gate electrode material layer can be the same as, or can be different from, the thickness of the at least one first gate electrode material layer.

Excess portions of the second gate dielectric material layer and the at least one second gate electrode material layer can be removed from above the top surface of the planarization dielectric layer 60 by a planarization process, which can employ, for example, chemical mechanical planarization (CMP). A remaining portion of the second gate dielectric material layer within the second gate cavity 59B constitutes a second gate dielectric 50B, and a remaining portion of the at least one second gate electrode material layer within the second gate cavity 59B constitutes a second gate electrode 52B. The second gate dielectric 50B and the second gate electrode 52B collectively fill the second gate cavity 59B and constitute a gate stack structure, which is herein referred to as a second replacement gate stack structure (50B, 52B).

Thus, the second disposable gate stack structure (50B, 48) is replaced with a second replacement gate stack structure (50B, 52B) while the first replacement gate stack structure (50A, 52A) remains within the planarization dielectric layer 60. In one embodiment, the second disposable gate stack structure (50B, 48) can be replaced with a second replacement gate stack structure (50B, 52B) while the entirety of the first replacement gate stack structure (50A, 52A) remains within the planarization dielectric layer 60. In one embodiment, the top surface of the second disposable gate stack structure (40B, 48) can be substantially coplanar with the top surface of the planarization dielectric layer 60 after formation of the second replacement gate stack structure (50B, 52B).

The selection of the material(s) of the at least one second gate electrode material layer can be performed so that performance may be optimized, or maximized, for a field effect transistor including the second source region 34B, the second drain region 36B, the second body region 32B, and the second replacement gate stack structure (50B, 52B). The thickness and composition of the first and second gate dielectrics (50A, 5B) can be independently optimized. Further, the compositions of the first gate electrode 52A and the second gate electrode 52B can be independently optimized. Correspondingly, the first and second gate dielectrics (50A, 50B) can have the same composition or different compositions, and can have the same thickness or different thicknesses. The first gate electrode 52A and the second gate electrode 52B can have the same composition, or can have different compositions. Particularly, a workfunction metal portion (not shown) within the first gate electrode 52A and a workfunction metal portion (not shown) within the second gate electrode 52B can have the same composition or different compositions, and can have the same thickness or different thicknesses.

Figure 14:
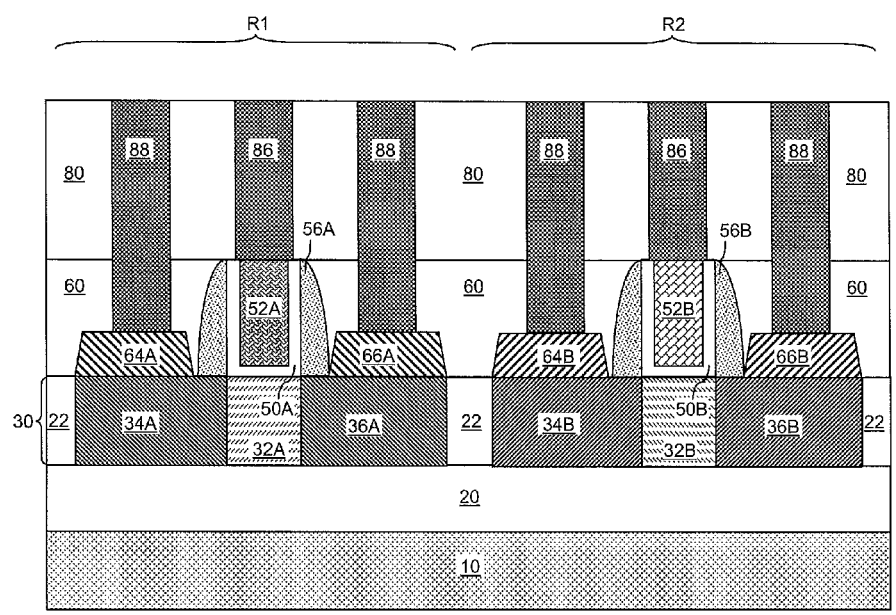
FIG. 14 is a vertical cross-sectional view of the exemplary semiconductor structure after formation of a contact-level dielectric layer and various contact via structures according to an embodiment of the present disclosure.

Referring to FIG. 14, a contact-level dielectric layer 80 can be deposited over the planarization dielectric layer 60. Various contact via structures can be formed through the contact-level dielectric layer 80. The various contact via structures can include, for example, gate contact via structures 86 that extend through the contact-level dielectric layer 80 and contact one of the gate electrodes (52A, 52B), and active region contact via structures 88 that extend through a stack of the contact-level dielectric layer 80 and the planarization dielectric layer 60 and contact one of the source regions (34A, 34B) and the drain regions (36A, 36B).

Figure 15:
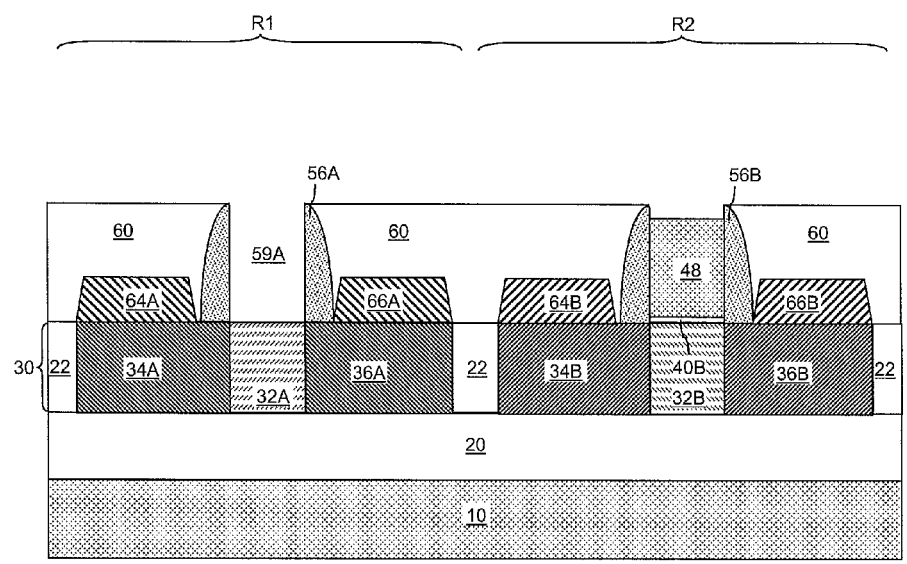
FIG. 15 is a vertical cross-sectional view of a variation of the exemplary semiconductor structure after removal of the first disposable gate stack structure according to an embodiment of the present disclosure.

Referring to FIG. 15, a variation of the exemplary semiconductor structure can be derived from the exemplary semiconductor structure of FIG. 9 if the selectivity of the etch that removes one of the first and second disposable gate material portions (42, 48) relative to the other of the first and second disposable gate material portions (42, 48) is not high enough, and a recessed region is formed over a remaining portion of the other of the first and second disposable gate material portions (42, 48). For example, the top surface of the second disposable gate material portion 48 may be recessed relative to the top surface of the planarization dielectric layer 60 after formation of the first gate cavity 59A.

Figure 16:
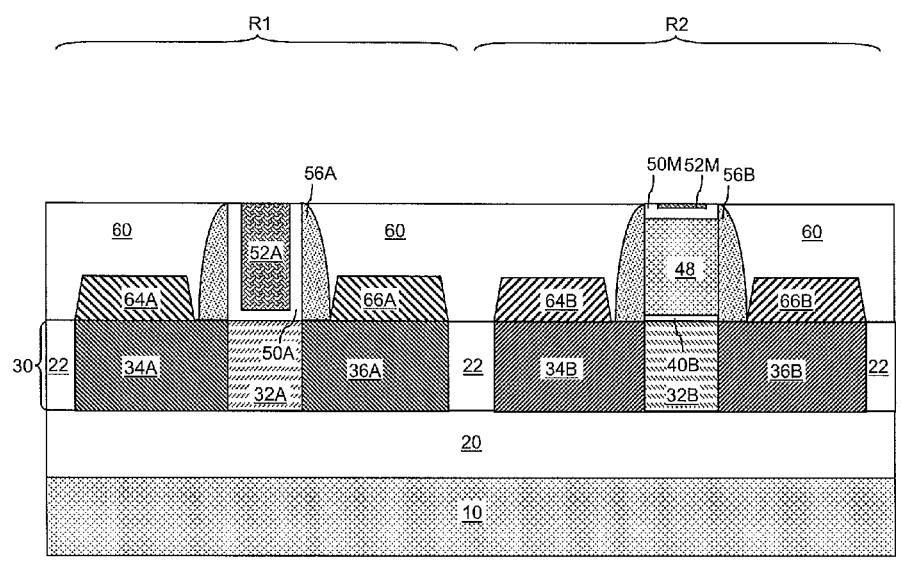
FIG. 16 is a vertical cross-sectional view of the variation of the exemplary semiconductor structure after formation of a first replacement gate stack structure and a miscellaneous gate stack structure according to an embodiment of the present disclosure.

Referring to FIG. 16, a material portion including a same material as the conductive material within the first replacement gate stack structure (50A, 52A), i.e., the conductive material of the first gate electrode 52A, can be formed above the remaining portion of the second disposable gate stack structure (40B, 48) and below the horizontal plane of a top surface of the planarization dielectric layer 60 after formation of the first replacement gate stack structure (50A, 52A). This material portion is herein referred to as a miscellaneous conductive material portion 52M. Further, a material portion including a same material as the dielectric material within the first replacement gate stack structure (50A, 52A), i.e., the first gate dielectric 50A, can be formed above the remaining portion of the second disposable gate stack structure (40B, 48) and below the horizontal plane of a top surface of the planarization dielectric layer 60 after formation of the first replacement gate stack structure (50A, 52A). This material portion is herein referred to as a miscellaneous dielectric material portion 50M. The miscellaneous dielectric material portion 50M and the miscellaneous conductive material portion 52M are collectively referred to as a miscellaneous disposable gate stack structure (50M, 52M).

Figure 17:
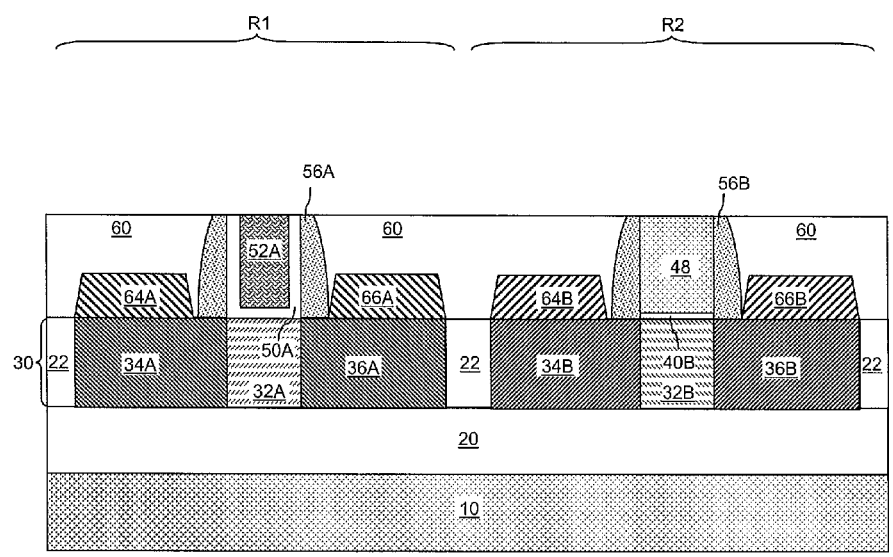
FIG. 17 is a vertical cross-sectional view of the variation of the exemplary semiconductor structure after removal of the miscellaneous disposable gate stack structure by planarization according to an embodiment of the present disclosure.

Referring to FIG. 17, a further planarization process is performed to remove the miscellaneous dielectric material portion 50M and the miscellaneous conductive material portion 52M. Surfaces of the first and second gate spacers (56A, 56B) can include planar surfaces that are coplanar with a horizontal top surface of the planarization dielectric layer 60.

Figure 18:
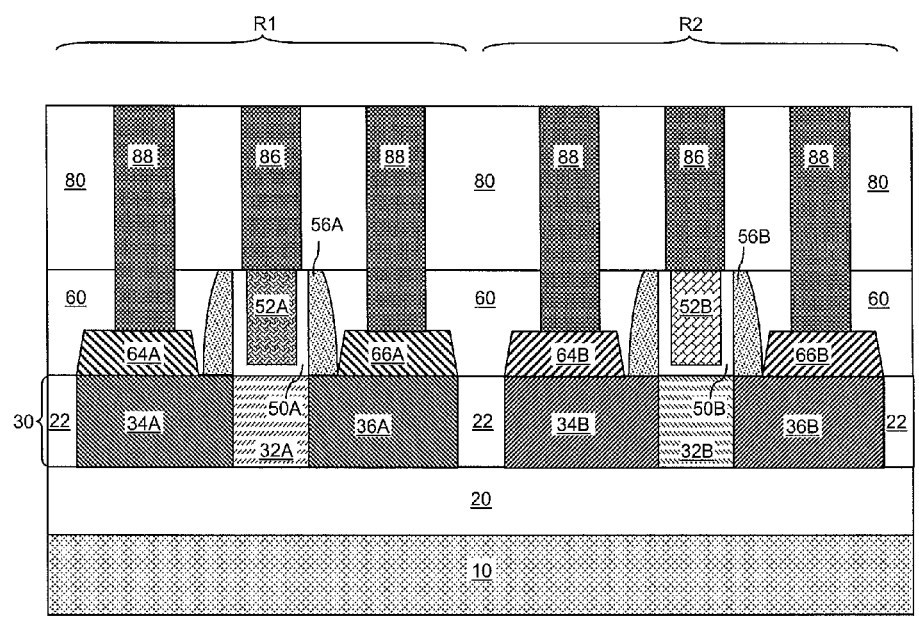
FIG. 18 is a vertical cross-sectional view of the variation of the exemplary semiconductor structure after formation of a contact-level dielectric layer and various contact via structures according to an embodiment of the present disclosure.

Referring to FIG. 18, the processing steps of FIG. 14 can be performed to form a contact-level dielectric layer 80 and various contact via structures (86, 88) embedded therein.

Figure 19:
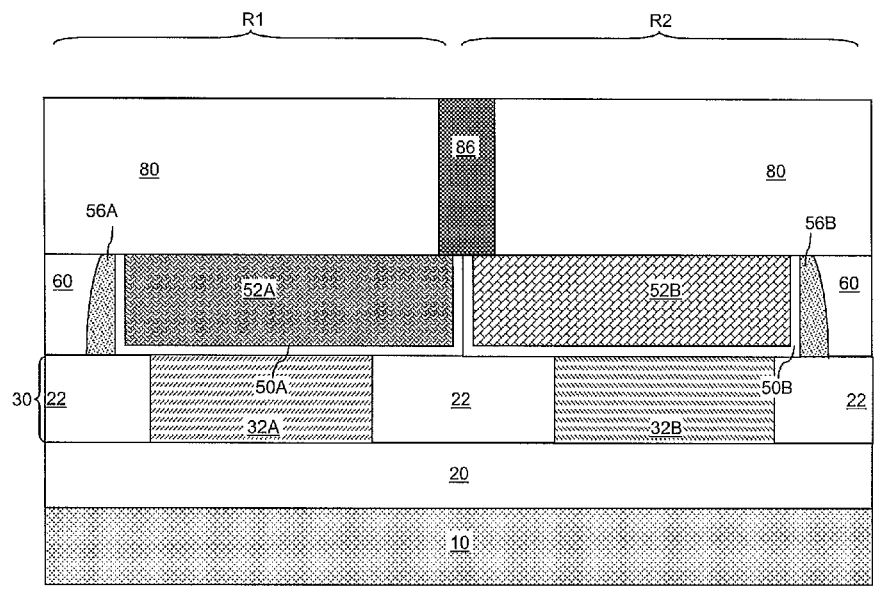
FIG. 19 is a vertical cross-sectional view of another variation of the exemplary semiconductor structure after formation of a contact-level dielectric layer and various contact via structures according to an embodiment of the present disclosure.

Referring to FIG. 19, another variation of the exemplary semiconductor structure is shown after formation of a contact-level dielectric layer 80 and various contact via structures embedded therein (86, 88). This variation can be provided by forming a first disposable gate stack structure (40A, 42) and a second disposable gate stack structure (40B, 48) to laterally abut each other at the processing step of FIG. 7. Subsequently, the first disposable gate stack structure (40A, 42) and the second disposable gate stack structure (40B, 48) are substituted with replacement gate stack structures (50A, 52A; 50B, 52B) and a contact-level dielectric layer 80 and various contact via structures (86, 88) are formed employing the methods of the processing steps of FIGS. 8-14.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a semiconductor structure comprising:
    forming a first disposable gate stack structure comprising a first disposable gate material portion and a second disposable gate stack structure comprising a second disposable gate material portion in a first device region and in a second device region, respectively, on a semiconductor substrate, wherein said forming said first disposable gate stack structure and said second disposable gate stack structure comprises providing a first disposable gate material layer in said first device region and a second disposable gate material layer in said second device region, wherein one of said first disposable gate material layer or said second disposable gate material layer has a protruding portion, performing a touch-up planarization process to remove said protruding portion and to provide said first disposable gate material layer and said second disposable gate material layer with topmost surfaces that are coplanar to each other, and patterning said first disposable gate material layer and said second disposable gate material layer to provide said first disposable gate material portion and said second disposable gate material portion;
    depositing a planarization dielectric layer over said first and second disposable gate stack structures;
    physically exposing top surfaces of said first and second disposable gate stack structures by planarizing said planarization dielectric layer;
    replacing said first disposable gate stack structure with a first replacement gate stack structure employing a step of removing said first disposable gate stack through a simultaneous exposure of said first disposable gate structure and said second disposable gate structure to a same etch chemistry in an etch process, wherein at least a predominant portion of said second disposable gate stack structure remains within said planarization dielectric layer after said etch process; and replacing said second disposable gate stack structure with a second replacement gate stack structure while said first replacement gate stack structure remains within said planarization dielectric layer.

2. A method of forming a semiconductor structure comprising:

forming a first disposable gate stack structure comprising a first disposable gate material portion and a second disposable gate stack structure comprising a second disposable gate material portion in a first device region and in a second device region, respectively, on a semiconductor substrate, wherein said forming said first disposable gate stack structure and said second disposable gate stack structure comprises providing a first disposable gate material layer in said first device region and a second disposable gate material layer in said second device region, wherein one of said first disposable gate material layer or said second disposable gate material layer has a protruding portion, performing a touch-up planarization process to remove said protruding portion and to provide said first disposable gate material layer and said second disposable gate material layer with topmost surfaces that are coplanar to each other, and patterning said first disposable gate material layer and said second disposable gate material layer to provide said first disposable gate material portion and said second disposable gate material portion;

depositing a planarization dielectric layer over said first and second disposable gate stack structures;

physically exposing top surfaces of said first and second disposable gate stack structures by planarizing said planarization dielectric layer;

replacing said first disposable gate stack structure with a first replacement gate stack structure at least a predominant portion of said second disposable gate stack structure remains within said planarization dielectric layer; and replacing said second disposable gate stack structure with a second replacement gate stack structure while said first replacement gate stack structure remains within said planarization dielectric layer, wherein said first disposable gate stack structure includes a portion having a composition that is different from any composition that is present within said second disposable gate stack structure.

3. The method of claim 1, wherein said second disposable gate material portion has a different composition than said first disposable gate material portion.

4. The method of claim 3, wherein said first disposable gate material portion is removed at an etch rate that is at least 3 times greater than an etch rate of said second disposable gate material portion under said same etch chemistry in said etch process.

5. The method of claim 3, wherein said first disposable gate material portion is removed at an etch rate that is at least 10 times greater than an etch rate of said second disposable gate material portion under said same etch chemistry in said etch process.

6. The method of claim 3, wherein said first disposable gate material portion comprises a first semiconductor material, and said second disposable gate material portion comprises a second semiconductor material.

7. The method of claim 6, wherein said first semiconductor material comprises a first semiconductor material, and said second semiconductor material comprises a second semiconductor material that is different from said first semiconductor material.

8. The method of claim 6, wherein one of said first semiconductor material and said second semiconductor material comprises an elemental semiconductor material, and another of said first semiconductor material and said second semiconductor material comprises a compound semiconductor material.

9. The method of claim 6, wherein one of said first semiconductor material and said second semiconductor material comprises a semiconductor material, and another of said first semiconductor material and said second semiconductor material comprises a metallic material.

10. The method of claim 1, further comprising forming a disposable gate dielectric layer on a surface of said semiconductor substrate prior to forming said first disposable gate material layer, wherein said first disposable gate stack structure comprises a first portion of said disposable gate dielectric layer and said second disposable gate stack structure comprises a second portion of said disposable gate dielectric layer.

11. The method of claim 1, wherein said first disposable gate material layer is deposited in said first and second device regions simultaneously, and said method further comprises removing a portion of said first disposable gate material layer from said second device region.

12. The method of claim 11, wherein said second disposable gate material layer is deposited in said first and second device regions simultaneously, and said method further comprises removing a portion of said second disposable gate material layer from said first device region.

13. The method of claim 1, further comprising:

depositing a hard mask layer over one of said first and second disposable gate material layers; and patterning said hard mask layer to remove a portion of said hard mask layer from one of said first and second device regions, wherein another of said first and second disposable gate material layers is formed over a patterned portion of said hard mask layer.

14. The method of claim 13, further comprising:

removing a portion of said another of said first and second disposable gate material layers by planarization employing said patterned portion of said hard mask layer as a stopping layer; and removing said patterned portion of said hard mask layer.

15. The method of claim 1, further comprising:

forming a first gate spacer around said first disposable gate stack structure prior to depositing said planarization dielectric layer; and forming a second gate spacer around said second disposable gate stack structure prior to depositing said planarization dielectric layer.

16. The method of claim 1, wherein a top surface of said second disposable gate stack structure is coplanar with a top surface of said planarization dielectric layer after formation of said first replacement gate stack structure.

17. A method of forming a semiconductor structure comprising:

forming a first disposable gate stack structure comprising a first disposable gate material portion and a second disposable gate stack structure comprising a second disposable gate material portion in a first device region and in a second device region, respectively, on a semiconductor substrate, wherein said forming said first disposable gate stack structure and said second disposable gate stack structure comprises providing a first disposable gate material layer in said first device region and a second disposable gate material layer in said second device region, wherein one of said first disposable gate material layer or said second disposable gate material layer has a protruding portion, performing a touch-up planarization process to remove said protruding portion and to provide said first disposable gate material layer and said second disposable gate material layer with topmost surfaces that are coplanar to each other, and patterning said first disposable gate material layer and said second disposable gate material layer to provide said first disposable gate material portion and said second disposable gate material portion;

depositing a planarization dielectric layer over said first and second disposable gate stack structures;

physically exposing top surfaces of said first and second disposable gate stack structures by planarizing said planarization dielectric layer;

replacing said first disposable gate stack structure with a first replacement gate stack structure at least a predominant portion of said second disposable gate stack structure remains within said planarization dielectric layer; and replacing said second disposable gate stack structure with a second replacement gate stack structure while said first replacement gate stack structure remains within said planarization dielectric layer, wherein a top surface of said second disposable gate stack structure is recessed relative to a top surface of said planarization dielectric layer after removal of said first disposable gate stack structure.

18. The method of claim 17, wherein a material portion comprising a same material as a conductive material within said first replacement gate stack structure is formed above a remaining portion of said second disposable gate stack structure and below a horizontal plane of a top surface of said planarization dielectric layer after formation of said first replacement gate stack structure.

* * * * *